(12) United States Patent
Teh et al.

(10) Patent No.: US 12,394,713 B2
(45) Date of Patent: *Aug. 19, 2025

(54) FABRIC DIE TO FABRIC DIE INTERCONNECT FOR MODULARIZED INTEGRATED CIRCUIT DEVICES

(71) Applicant: Intel Corporation, Santa Clara, CA (US)

(72) Inventors: Chee Hak Teh, Bayan Lepas (MY); Chee Seng Leong, Gelugor (MY); Lai Guan Tang, Tanjung Bungah (MY); Han Wooi Lim, Bayan Lepas (MY); Hee Kong Phoon, Bayan Lepas (MY)

(73) Assignee: Altera Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/670,390

(22) Filed: May 21, 2024

(65) Prior Publication Data

US 2024/0312909 A1    Sep. 19, 2024

Related U.S. Application Data

(63) Continuation of application No. 18/137,405, filed on Apr. 20, 2023, now Pat. No. 12,009,298, which is a continuation of application No. 17/131,464, filed on Dec. 22, 2020, now Pat. No. 11,670,589, which is a continuation of application No. 16/456,647, filed on Jun. 28, 2019, now Pat. No. 10,886,218.

(51) Int. Cl.
*H01L 23/528* (2006.01)
*H01L 23/498* (2006.01)
*H03K 19/17704* (2020.01)

(52) U.S. Cl.
CPC ...... *H01L 23/528* (2013.01); *H01L 23/49816* (2013.01); *H03K 19/17704* (2013.01)

(58) Field of Classification Search
CPC ............. H01L 23/528; H01L 23/49816; H01L 23/5382; H01L 23/49833; H01L 23/5283; H01L 2224/16225; H01L 2924/15192; H01L 23/4824; H01L 23/5386; H01L 25/18; H03K 19/17704
USPC ......................................................... 257/737
See application file for complete search history.

(56) References Cited

U.S. PATENT DOCUMENTS

| | | |
|---|---|---|
| 10,886,218 B2 | 1/2021 | Teh |
| 11,036,660 B2 | 6/2021 | Ooi |
| 11,670,589 B2 | 6/2023 | Teh |

(Continued)

*Primary Examiner* — Caleen O Sullivan
(74) *Attorney, Agent, or Firm* — Fletcher Yoder, P.C.

(57) ABSTRACT

The presently disclosed programmable fabric die includes a direct fabric die-to-fabric die interconnect interface column disposed in a sector of programmable logic fabric. Each row of the interconnect interface column includes at least one interconnect interface that is electrically coupled to a microbump. The microbump is configured to be electrically coupled to another microbump of another interconnect interface of another fabric die through an interposer. The fabric die may include multiple interconnect interface columns that each extend deep into the sector, enabling low latency connections between the fabric dies and reducing routing congestion. In some embodiments, the fabric die may include interconnect interfaces that are instead distributed throughout logic blocks of the sector.

20 Claims, 6 Drawing Sheets

(56) References Cited

U.S. PATENT DOCUMENTS 12,009,298 B2 * 6/2024 Teh .................. H01L 23/49816
2019/0227963 A1 7/2019 Ooi et al.

* cited by examiner

FABRIC DIE TO FABRIC DIE INTERCONNECT FOR MODULARIZED INTEGRATED CIRCUIT DEVICES

This application is a continuation of U.S. patent application Ser. No. 18/137,405, entitled "Fabric Die to Fabric Die Interconnect for Modularized Integrated Circuit Devices," filed Apr. 20, 2023, which is a continuation of U.S. Pat. No. 11,670,589, entitled "Fabric Die to Fabric Die Interconnect for Modularized Integrated Circuit Devices," filed Dec. 22, 2020, which is a continuation of U.S. Pat. No. 10,886,218, entitled "Fabric Die to Fabric Die Interconnect for Modularized Integrated Circuit Devices," filed Jun. 28, 2019, all of which are hereby incorporated by reference in their entirety for all purposes.

BACKGROUND

The present disclosure relates to connectivity between dies of an integrated circuit system, such as between programmable fabric dies of a modularized integrated circuit system.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Modern electronics, such as computers, portable devices, network routers, data centers, Internet-connected appliances, and more, tend to include at least one integrated circuit device. Integrated circuit devices may take on a variety of forms, including processors (e.g., central processing units (CPUs)), memory devices, and programmable devices (e.g., FPGA), to name only a few examples. The programmable devices, in particular, may include a programmable fabric of logic that may be programmed (e.g., configured) and reprogrammed (e.g., reconfigured) after manufacturing to provide a wide variety of functionality based on a circuit design.

To improve silicon yield, FPGAs may be disaggregated or physically divided and manufactured as smaller programmable logic fabric dies. The smaller dies may then be interconnected together to create a larger FPGA. In some cases, the fabric dies may be communicatively coupled through one or more embedded multi-die interconnect bridges (EMIBs) using peripheral interconnects of the smaller fabric dies, such as advanced interface buses (AIBs) or universal interface buses (UIBs). The peripheral interconnects may be disposed on one or more shorelines of the fabric die to avoid consuming excess routing circuitry of the fabric die, and may be accessible by horizontal and/or vertical input/output interfaces. However, the horizontal and/or vertical input/output interfaces may have limited reach into the fabric die and be limited in number due to the finite shorelines. As such, routing congestion may occur at the fabric die shoreline when data is sent to or received from other fabric dies, resulting in reduced device performance. Moreover, the peripheral interconnects may be built to support high bandwidth memory or transceiver transaction, and, as a result, may have high latency, which may be inefficient for fabric die-to-fabric die interconnect purposes.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Integrated circuits, such as field-programmable gate arrays (FPGAs), may include a programmable fabric (e.g., logic array blocks (LABs), having log elements such as digital signal processing (DSP) blocks, routing multiplexers (muxes), and so on) that may be configured and, in some cases, later reconfigured to realize a circuit design. Fabrication of a monolithic FPGA (e.g., an FPGA manufactured as a single die) may be economically inefficient and process intensive due to poor silicon yield (e.g., a number of improperly performing silicon dies on a wafer). To improve silicon yield, FPGAs may be disaggregated or physically divided and manufactured as smaller programmable logic fabric dies. The fabric dies may then be interconnected together to create a larger FPGA.

To enable fabric dies to communicate one another, the presently disclosed programmable fabric die includes a direct fabric die-to-fabric die interconnect (e.g., an Advanced Interface Bus-Direct (AIB-D)) interface (referred to as the "interconnect interface" or "inter-die interconnect interface") column disposed in one or more rows or sets of a sector of programmable logic fabric. The interconnect interface may communicatively couple to an interconnect interface of another fabric die via a silicon interposer (e.g., that includes links or electrical signal conduits).

The fabric die may include multiple interconnect interface columns. For example, a sector of programmable logic fabric of the fabric die may include ten interconnect interface columns that may extend deep into the sector (e.g., such that multiple rows of the sector include the interconnect interface columns), enabling low latency connections between the fabric dies. In addition, the placement of the direct interconnect columns may reduce routing congestion as compared to the HIOs/VIOs traditionally used in monolithic FPGA designs.

Figure 1:
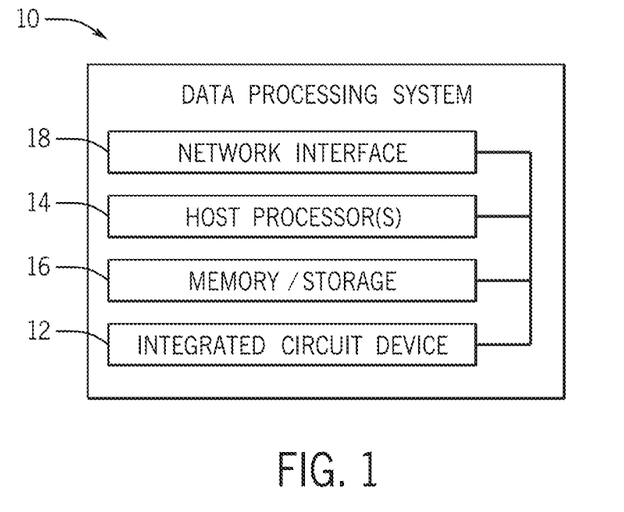
FIG. 1 is a block diagram of a data processing system including an integrated circuit device, according to embodiments of the present disclosure.

With the foregoing in mind, FIG. 1 is a block diagram of a data processing system 10 including an integrated circuit device 12, according to embodiments of the present disclosure. The data processing system 10 may include more or fewer components (e.g., including electronic display, user interface structures, application specific integrated circuits (ASICs)) than shown. The data processing system 10 may include one or more host processors 14, such as an INTEL® Xeon® processor or a reduced-instruction processor (e.g., a reduced instruction set computer (RISC) or an Advanced RISC Machine (ARM) processor) that may manage a data processing requests for the data processing system 10 (e.g., to perform machine learning, video processing, voice recognition, image recognition, data compression, database search ranking, bioinformatics, network security pattern identification, spatial navigation, or the like).

The host processor(s) 14 may communicate with the memory and/or storage circuitry 16, which may include a tangible, non-transitory, machine-readable-medium, such as random-access memory (RAM), read-only memory (ROM), one or more hard drives, flash memory, or any other suitable optical, magnetic or solid-state storage medium. The memory and/or storage circuitry 16 may store data to be processed by the data processing system 10, such as processor-executable control software, configuration software, system parameters, configuration data, etc.

The data processing system 10 may also include a network interface 18 that enables the data processing system 10 to communicate with other electronic devices. In some embodiments, the data processing system 10 may be part of a data center that processes a variety of different requests. For instance, the data processing system 10 may receive a data processing request via the network interface 18 to perform machine learning, video processing, voice recognition, image recognition, data compression, database search ranking, bioinformatics processes, network security pattern identification, spatial navigation, or other specialized tasks.

The data processing system 10 may further include the integrated circuit device 12 that facilitates performs data processing tasks.

Figure 2:
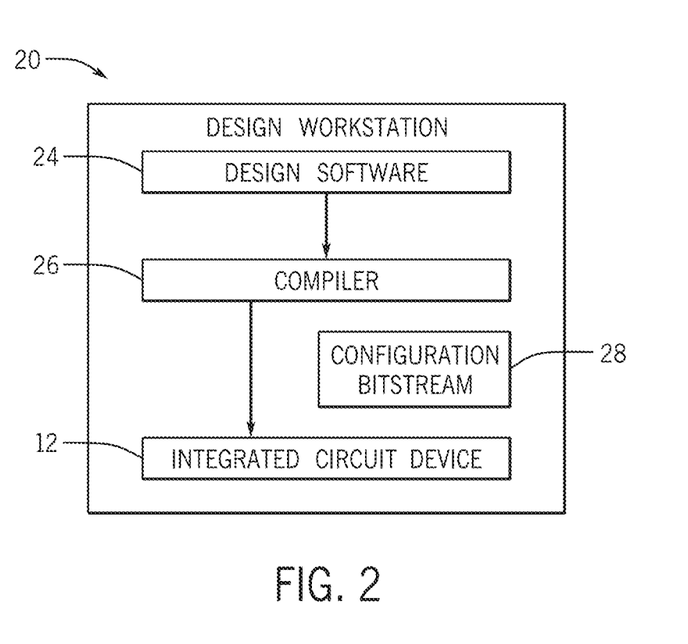
FIG. 2 is a block diagram of a design workstation that may facilitate programming of the integrated circuit device of FIG. 1, according to embodiments of the present disclosure.

A designer may use a design workstation 20 to develop a design that may be implemented by and/or configure the integrated circuit device 12, as shown in FIG. 2, according to embodiments of the present disclosure. In some embodiments, the designer may use design software 24 (e.g., Intel® Quartus® by INTEL CORPORATION) to generate a design that may be used to program (e.g., configure) the integrated circuit device 12. For example, a designer may program a modularized integrated circuit device 12 to implement specific functionality, such as implementing a circuit design (e.g., higher-level circuit design), as if the integrated circuit device 12 were monolithic. The integrated circuit device 12 may be a programmable integrated circuit, such as a field-programmable gate array (FPGA), that includes one or more programmable fabric dies, which together may implement one or more circuit designs. Each programmable fabric die may also include one or more input/output (I/O) interfaces (e.g., microbumps and/or associated transmission, receiving, driving, and/or routing components) that enable the programmable fabric die to communicate with other devices or components (e.g., internal or external to the integrated circuit device 12).

As such, the design software 24 may use a compiler 26 to generate a lower-level circuit-design configuration for the integrated circuit device 12. That is, the compiler 26 may provide machine-readable instructions representative of the designer-specified functionality to the integrated circuit device 12, for example, in the form of a configuration bitstream 28. The host processor(s) 14 may coordinate the loading of the bitstream 28 onto the integrated circuit device 12 and subsequent programming of the programmable fabric.

Figure 3:
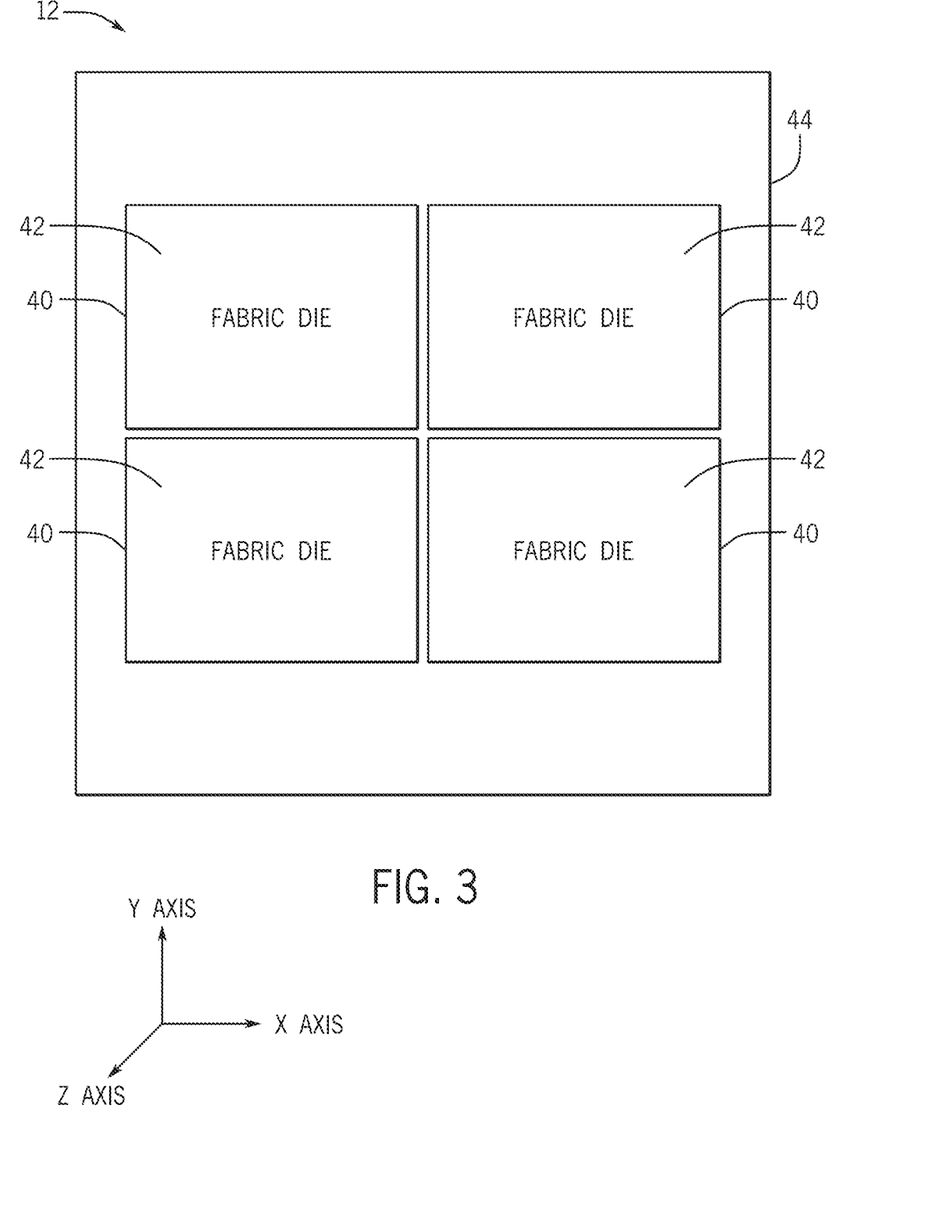
FIG. 3 illustrates an example of the integrated circuit device of FIG. 1 having multiple programmable logic fabric dies, according to embodiments of the present disclosure.

To improve scalability and silicon yield of the integrated circuit 12 (e.g., the FPGA), programmable logic fabric of the integrated circuit 12 may be modularized into multiple smaller programmable logic fabric dies. FIG. 3 illustrates an example of the integrated circuit device 12 having multiple programmable logic fabric dies 40, according to embodiments of the present disclosure. Although the integrated circuit device 12 is shown as an FPGA, it should be appreciated that the programmable logic fabric dies 40 may be disaggregated for any suitable type of integrated circuit device 12. The fabric dies 40 may include programmable logic fabric 42 (also referred to as "programmable fabric", "programmable logic", "programmable fabric circuitry", "programmable logic circuitry", and so on), which may be divided into one or more sectors and facilitate programming of the FPGA 12. It should be appreciated that each fabric die 40 may include different instances of programmable logic fabric (e.g., when compared to other fabric dies 40). For example, a fabric die 40 may include a different (e.g., higher or lower) number of digital signal processing (DSP) blocks than other fabric dies 40, a different (e.g., higher or lower) number of memory blocks than the other fabric dies 40, and so on. Moreover, in some cases, each fabric die 40 may include instances of core fabric, which may include, for example, transceivers and/or components of hard intellectual property cores, such as processor cores, Ethernet medium access control units, PCI/PCI Express controllers, external memory controllers, transistors, and so on.

The programmable logic fabric 42 may be arranged in groups (e.g., columns) that are sometimes referred to as configurable logic blocks (CLBs) or Logic Array Blocks (LABs). The programmable logic fabric 42 may also include memory LABs (MLABs), DSP blocks, routing multiplexers, and so on. In operation, the programmable logic fabric 42 may receive the configuration bitstream 28 from the host processor(s) 14, store the configuration bitstream 28 in configuration random access memory (CRAM) bits of the integrated circuit device 12, and may be configured according to the circuit design embodied in the configuration bitstream 28 stored in the CRAM bits. The fabric dies 40 may be configured or partially configured at run-time and/or may be re-configured or partially re-configured at a later time, enabling design flexibility post-manufacturing.

Communication between the fabric dies 40 on the integrated circuit device 12 may occur via an embedded interface bridge, such as a silicon interposer 44 (e.g., through signal-conducting channels in the silicon base material). That is, intra-fabric communication within the fabric die 40 may be performed without use of the interposer 44 (e.g., without signals entering the signal-conducting channels of the interposer 44). Inter-programmable fabric die communication (e.g., fabric die-to-fabric die communication between two different fabric dies 40) may occur through the channels and/or interfaces disposed in the interposer 44.

Figure 4:
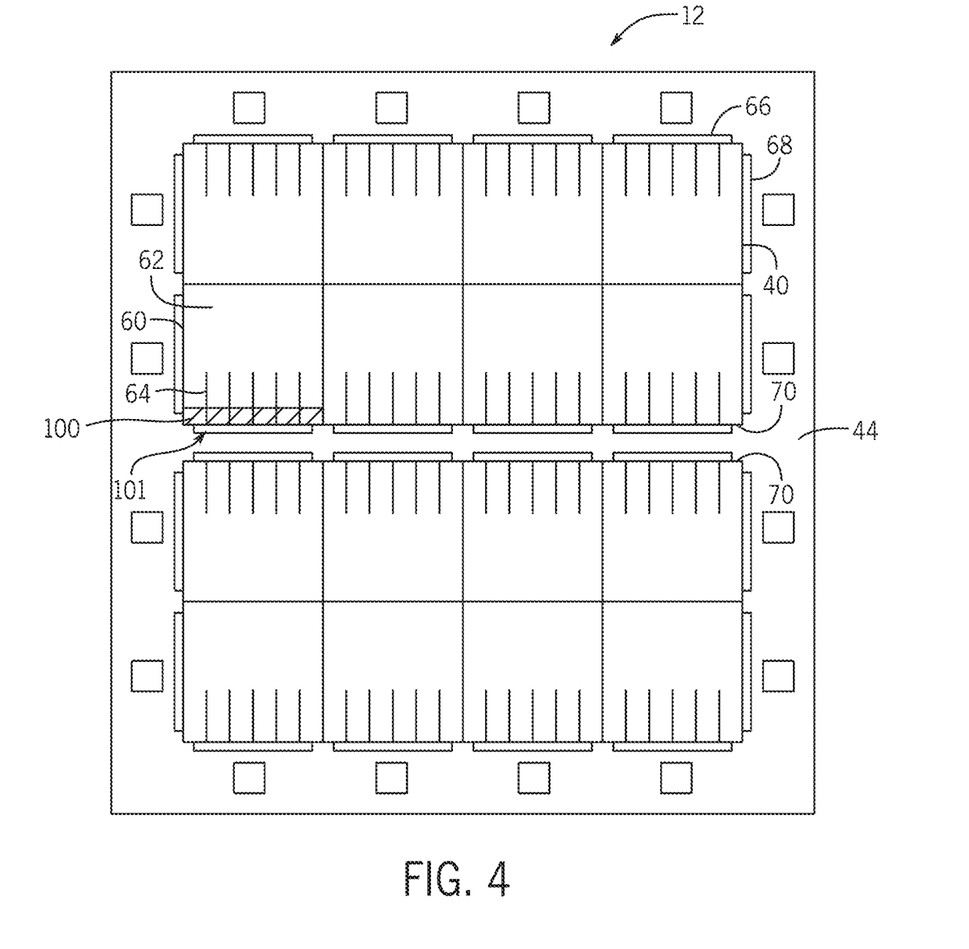
FIG. 4 is a top view of the integrated circuit device of FIG. 3, according to embodiments of the present disclosure.

A top view of the disaggregated FPGA device 12 of FIG. 3 is shown in FIG. 4, which further illustrates the connectivity and placement architecture for the modularized programmable fabric dies 40, which may also be referred to as tiles, according to embodiments of the present disclosure. It should be appreciated that while the FPGA device 12 is shown with a certain number of fabric dies 40, connections, and components, the present disclosure contemplates any suitable variations of the FPGA device 12.

As depicted, the programmable fabric dies 40 of the FPGA device 12 each include multiple sectors 60 of programmable logic fabric 62 (which is the same as the programmable logic fabric 42 described in FIG. 3 above). Each fabric die 40 also includes the direct fabric die-to-fabric die interconnect (e.g., the Advanced Interface Bus-Direct (AIB-D)) interface (the "interconnect interface") 64 that provides connection between dies 40 without using network-based communication. Each interconnect interface 64 may be electrically coupled to routing fabric (e.g., routing circuitry, routing multiplexers, and/or other suitable routing components) of the fabric die 40 and may bridge horizontal wires from the fabric die 40 to a second fabric die 40. In particular, the interconnect interfaces 64 may be coupled to microbumps of the fabric die 40, which may be spread across the fabric die 40. As such, the number of interconnect interfaces 64 for each fabric die 40 may be based on the number of microbumps of the fabric die 40 and/or may be defined by a specification that conforms the interface between fabric glue dies 40. For example, a fabric die 40 may have one interconnect interface 64 for each microbump.

The interconnect interfaces 64 may be distributed in a greater or lesser number of columns, and/or wider or thinner columns, to facilitate communication with increased shoreline reach and/or increased routing flexibility, without using network-based communication (e.g., network-on-chip components), such that the fabric die-to-fabric die communication may occur without consuming excess amounts of routing circuitry of the programmable logic fabric 62 in the fabric die 40. For example, as illustrated, the interconnect interfaces 64 may be distributed in five columns per sector 60, thus increasing the shoreline reach five times than in the case where only horizontal connections of the fabric die 40 are used for fabric die-to-fabric die communication. It should be appreciated that any suitable number of columns of interconnect interfaces 64 and any suitable width of columns may be included in the fabric dies 40, such as ten columns each having a width of one interconnect interface 64, one column each having a width of two interconnect interfaces 64, and so on.

FIG. 4 also shows horizontal input/output (HIO) interfaces 66 and vertical input/output (VIO) interfaces 68 that may be electrically coupled to the sectors 60 of the fabric dies 40. The HIO/VIO interfaces 66, 68 may enable signals to be sent from a first fabric die 40 to a device or component external to the first fabric die 40, such as a second fabric die 40 (e.g., via the interposer 44). However, because the HIO/VIO interfaces 66, 68 are disposed near shorelines (e.g., 70) of the fabric dies 40, routing congestion may occur at the shorelines 70 when data is sent to or received from other fabric dies, resulting in reduced device performance.

Figure 5:
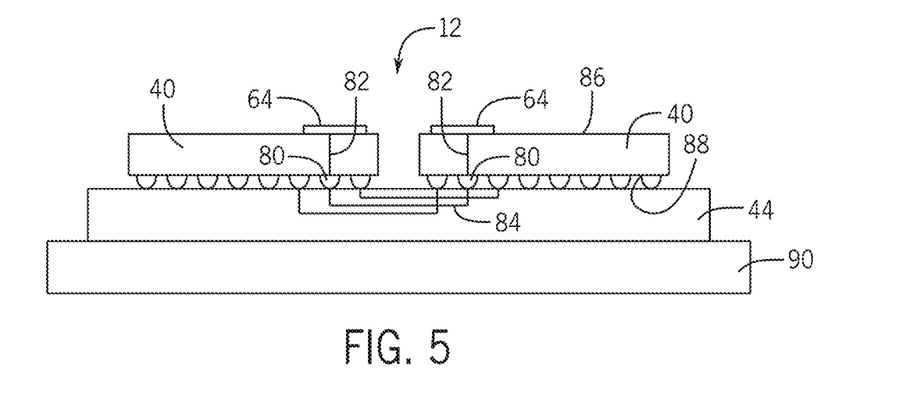
FIG. 5 is a side view of the integrated circuit device of FIG. 3, according to embodiments of the present disclosure.

Additionally, as shown by FIG. 5, which illustrates a side view of the disaggregated FPGA device 12 of FIG. 3, according to embodiments of the present disclosure, the fabric dies 40 may rest on the silicon interposer (e.g., passive interposer) 44. Each interconnect interface 64 of a fabric die 40 may be electrically coupled to programmable logic fabric 42 of the fabric die 40 (e.g., via routing circuitry of the fabric die 40). Each interconnect interface 64 may also be electrically coupled to a respective microbump 80 of the fabric die 40 via a wire or conductor 82. Microbumps 80 may in turn be electrically coupled to other microbumps 80 of other fabric dies 40. The other microbumps 80 may be electrically coupled to other interconnect interfaces 64 of the other fabric dies 40, which may be electrically coupled to other programmable logic fabric 42 of the other fabric dies 40 (e.g., via other routing circuitries of the other fabric dies 40). As illustrated, while the interconnect interfaces 64 may be disposed on a top surface 86 of the fabric dies 40, the microbumps 80 may be disposed on a bottom surface 88 of the fabric dies 40. As such, the wires or conductors 82 electrically coupling the interconnect interfaces 64 to the microbumps 80 may extend into the fabric dies 40 between the top and bottom surfaces 86, 88. In this manner, signals and/or data may be transmitted between fabric dies 40.

The silicon interposer 44 may in turn be supported by the package substrate 90, which facilitates electrical connections of the FPGA device 12. While the silicon interposer 44 is described as a passive interposer in many of the examples, in some embodiments, the silicon interposer 44 may also or alternatively contain active components and may be an active interposer.

Figure 6:
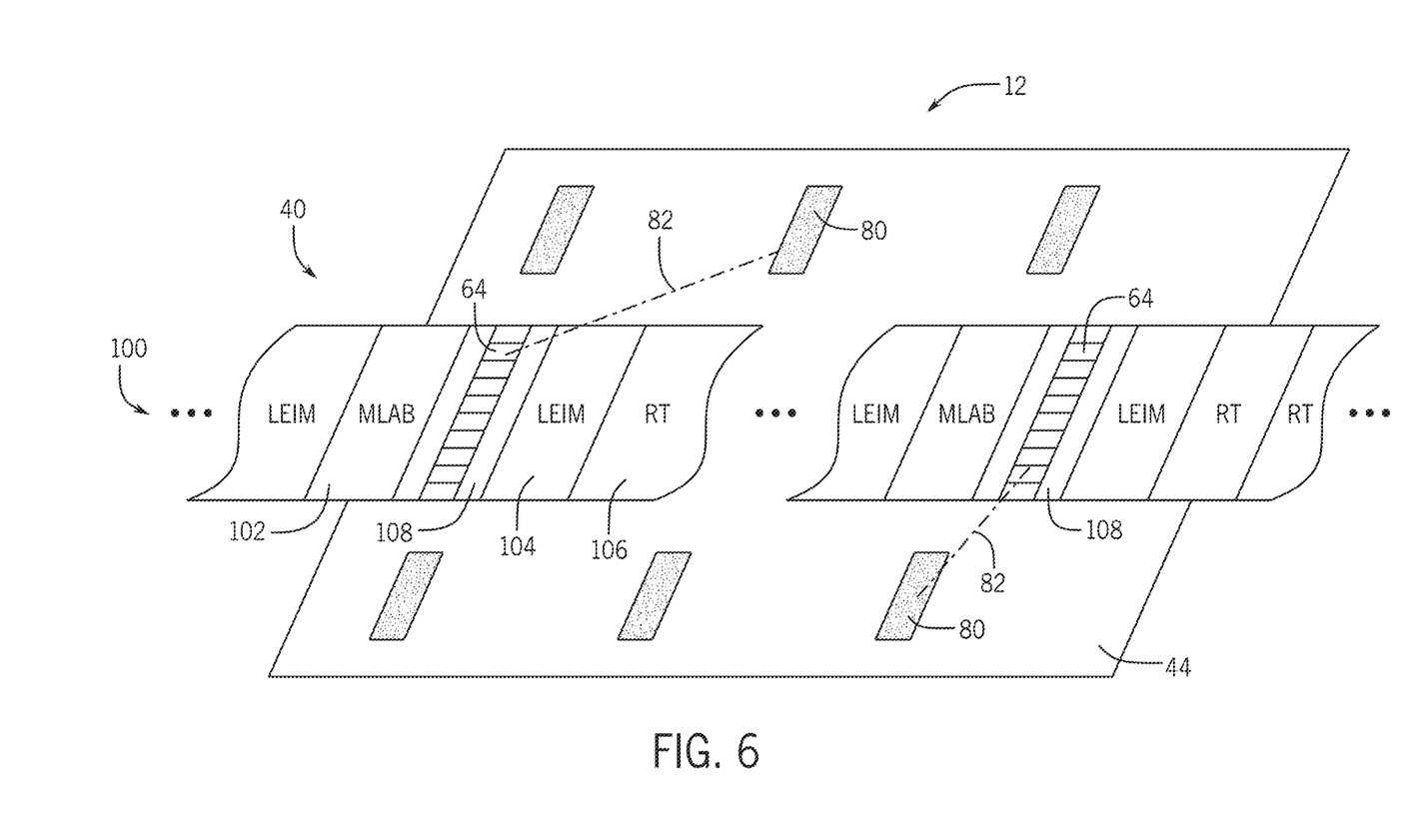
FIG. 6 is a perspective view of a portion of the integrated circuit device of FIG. 3 illustrating rows of a sector of a fabric die of the integrated circuit device and microbumps of the fabric die, according to embodiments of the present disclosure.

Each sector 60 of the fabric die 40 may include one or more rows or sets of logic blocks, such as between 1 and 200 rows (e.g., 10 rows, 42 rows, 43 rows, 50 rows, 100 rows, and so on), of components that facilitate processing and routing of data. Row 100, as seen in FIG. 4, may be part of and parallel to the shoreline 70 (e.g., an edge of the fabric die 40), and include interconnect interfaces 64. FIG. 6 is a perspective view of a portion of the FPGA device 12 of FIG. 3, according to embodiments of the present disclosure. As illustrated, rows (e.g., 100) of a sector 60 of the fabric die 40 may include a number of blocks having certain components that enable certain functionalities.

For example, the row 100 may include memory logic array blocks 102 (MLABs) that may provide programmable functionality to the fabric die 40 and may include memory resources that may store small amounts (e.g., kilobytes) of data. Rows of the fabric die 40 (including the row 100) may include logic array blocks (LABs) that may provide programmable functionality to the fabric die 40. The MLABs 102 and LABs may implement logic functions, arithmetic functions, register functions, and the like, based on the circuit design implemented (e.g., in the form of a bitstream 28 programmed in configuration random access memory (CRAM) bits of the FPGA device 12 corresponding to the MLABs 102 and/or LABs). The row 100 may also include logic element input multiplexer (LEIM) blocks 104, which may act as selection circuits that route signals from various portions of the fabric die 40, such as to or from logic blocks within the MLABs 102 and/or LABs based on the circuit design implemented (e.g., in the form of a bitstream programmed in CRAMs of the FPGA device 12 corresponding to the MLABs 102 and/or LABs).

The row 100 may include one or more interconnect blocks 108 where one or more interconnect interfaces 64 may be disposed. Any suitable number of interconnect interfaces 64 may be disposed in each interconnect block 108, such as between 1 and 200 interconnect interfaces 64, 10 and 14 interconnect interfaces 64, and so on. Each interconnect interface 64 may electrically couple to a respective microbump 80. The microbumps 80 may be unidirectional or bidirectional. That is, if the microbumps 80 are unidirectional, each microbump 80 may be configured to send signals to another fabric die 40, or receive signals from another fabric die 40. If the microbumps 80 are bidirectional, each microbump 80 may be configured to both send signals to and receive signals from another fabric die 40.

As such, to send data to another fabric die 40, data on the fabric die 40 may be sent to the one or more interconnect interfaces 64 of the interconnect block 108 that stretch deep into the sector 60. That is, data on the fabric die 40 may be sent to, for example, an MLAB 102 of the row 100 that borders or is adjacent to the interconnect block 108 to be processed or to an LEIM block 104 of the row 100 that borders or is adjacent to the interconnect block 108 to be multiplexed via, for example, a routing fabric or circuitry (RT) block 106 of the row 100. The RT block 106 may include one or more programmable interconnect blocks that connect incoming data channels to outgoing data channels, and thus may route data signals between blocks of the row 100.

Similarly, to receive data from another fabric die 40, the one or more interconnect interfaces 64 of the interconnect block 108 may receive the data from one or more respective microbumps 80. The interconnect block 108 may then send the data to, for example, an MLAB 102 of the row 100 that borders or is adjacent to the interconnect block 108 to be processed or to an LEIM block 104 of the row 100 that borders or is adjacent to the interconnect block 108 to be multiplexed. An RT block 106 of the row 100 may receive the data from the MLAB 102 or the LEIM block 104 and route the data to additional blocks of the row 100 for further processing. In one embodiment, inputs from the core fabric to the interconnect interfaces 64 may be through the LEIM block 104 when transmitting data, and outputs may drive directly to the RT blocks 106.

Figure 7:
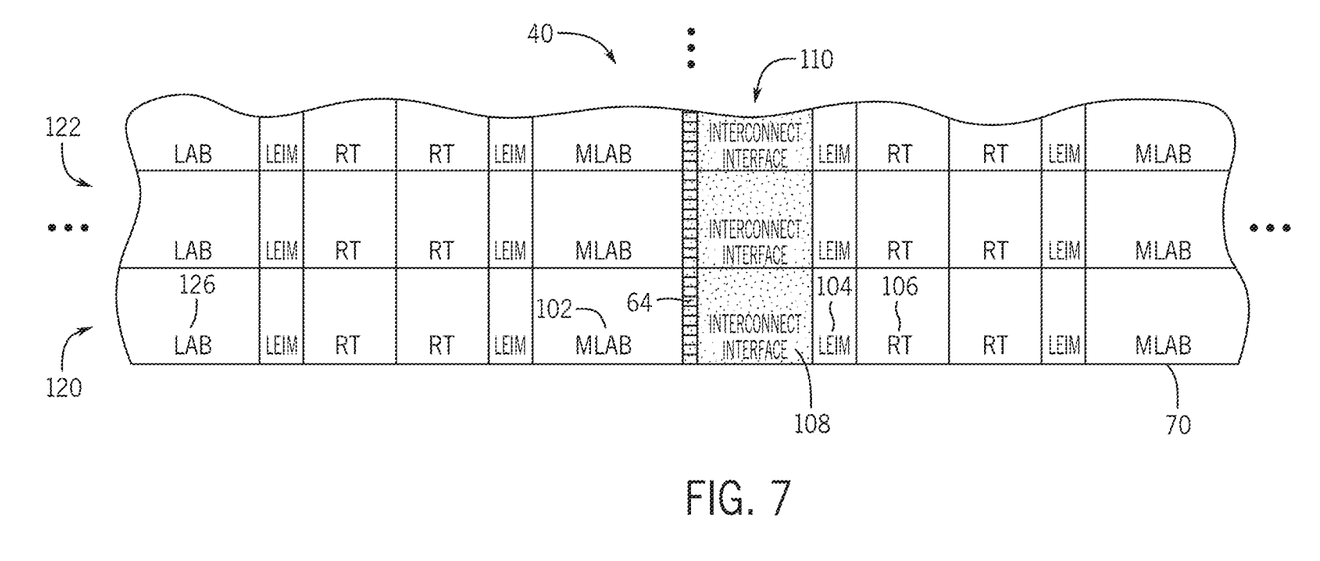
FIG. 7 is a diagram of portions of rows of programmable logic fabric of a sector of a fabric die of the integrated circuit device of FIG. 3 having a column of interconnect blocks, according to embodiments of the present disclosure.

As previously mentioned, the interconnect interface 64 may facilitate meeting connectivity demands between the fabric dies 40 with reduced latency and greater reach. In particular, the interconnect interface 64 may be disposed in one or more columns (e.g., in the interconnect block 108) and include a unidirectional or bidirectional input/output (I/O) buffer that facilitates wire-to-wire connectivity. For example, FIG. 7 is a diagram of portions of rows (e.g., 120, 122) of programmable logic fabric 42 of a sector 60 of the fabric die 40 of the FPGA device 12 of FIG. 3, according to embodiments of the present disclosure. A first row 120 of the sector 60 may be disposed on, part of, and parallel to a shoreline 70 of the fabric die 40 (e.g., adjacent to another fabric die 40), while other rows of the sector 60 (e.g., such as a second row 122) may be disposed separate and further away from (and parallel to) the shoreline 70. As such, interconnect blocks 108 may be disposed in a column (e.g., 110) of the sector 60, and reach deep into the sector 60 (e.g., relative to the shoreline 70). For example, a sector 60 may include 42 rows of logic blocks. If a column 110 of interconnect blocks 108 reaches all the way across the sector 60 (e.g., from edge to edge or shoreline to shoreline), and there are 14 interconnect interfaces 64 per each interconnect block 108, then the column 110 of interconnect blocks 108 may include 588 interconnect interfaces 64. This greater reach may enable the interconnect interfaces 64 to more easily access (e.g., with shorter routing length and, thus latency) horizontal wires of the fabric die 40). The reduced latency across the fabric die 40 may have great implications on system performance. For example, wire delays across the fabric die 40 may be kept within 400 picoseconds. It should be understood that these numbers are used as illustrative examples, and each sector 60 may have more or less rows of logic blocks, each interconnect block 108 may have more or less interconnect interfaces 64, and, as a result, each column 110 of interconnect blocks 108 may include more or less interconnect interfaces 64. In this manner, the interconnect interface 64 may provide direct fabric die-to-fabric die connectivity without traversing a network-on-chip. The fabric die 40 may also include one or more columns of LAB blocks 126.

As such, to include the interconnect interface 64 in a sector of a fabric die, a column of blocks of the sector 60 of the fabric die, such as a LAB or MLAB column, may be replaced with the interconnect column 110. For example, in some cases, five LAB or MLAB columns in a fabric die may be replaced with an interconnect column 110, though any suitable number of LAB or MLAB columns (e.g., 1 to 100) may be replaced. In such an example, approximately 2300 wires or conductors may fit into five LAB or MLAB columns in a sector of a fabric die. These wires or conductors may be independently configured as receiving and/or transmission circuitry for the interconnect interfaces 64. To the programmable logic fabric 42 of the fabric die 40, this replacement may merely appear as if the LAB or MLAB column has been replaced by another intellectual property column (e.g., such as another LAB or MLAB column). That is, the interconnect interfaces 64 may be fully integrated into the core fabric of the fabric die 40 and share the configuration scheme (e.g., reuse local sector managers and/or CRAM bits on the LAB or MLAB columns that are replaced) and/or the clocking scheme of the core fabric.

Figure 8:
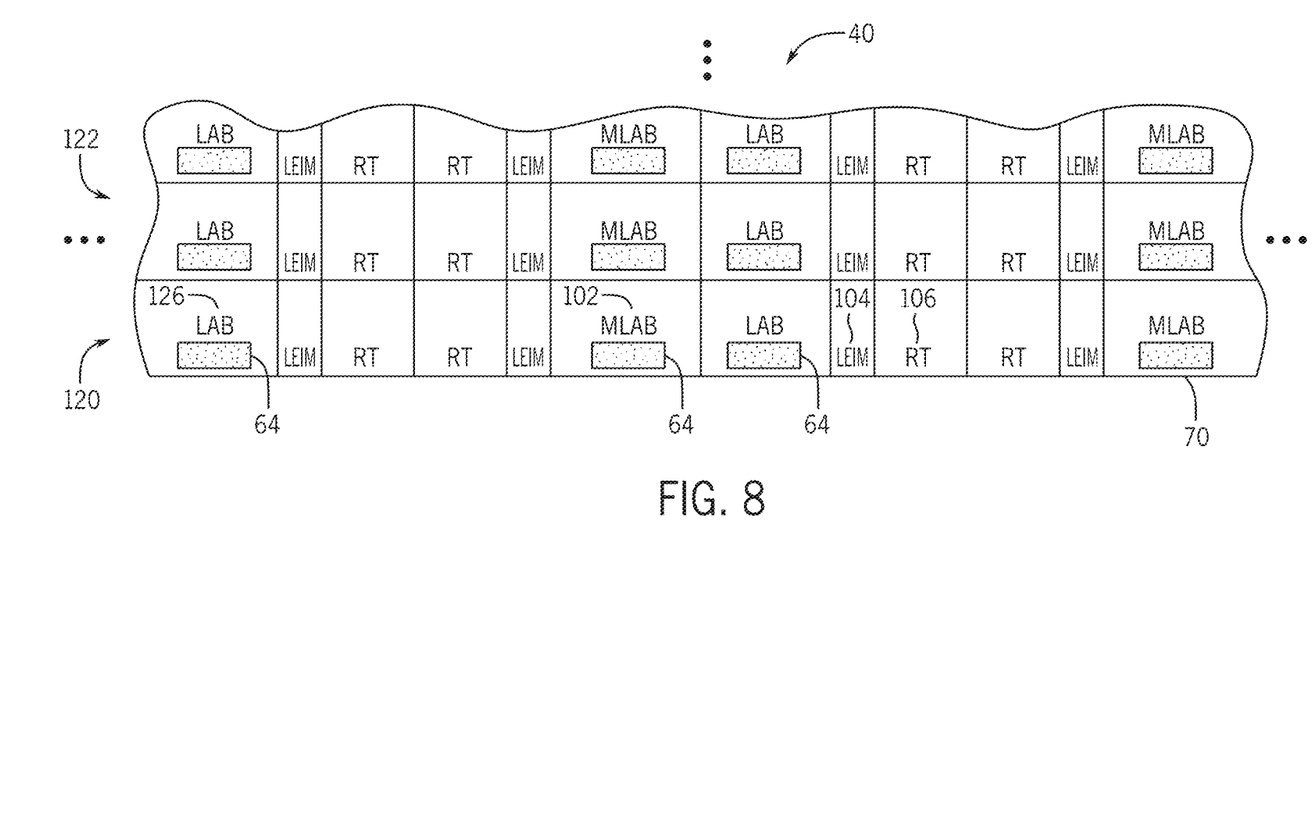
FIG. 8 is a diagram of portions of rows of programmable logic fabric of a sector of a fabric die of the integrated circuit device of FIG. 1 having distributed interconnect interfaces, according to embodiments of the present disclosure.

In additional or alternative embodiments, the interconnect interface 64 may be more greatly distributed (e.g., as opposed to grouping the interconnect interfaces 64 in one or more columns 110 of interconnect blocks 108). For example, as shown in FIG. 8, an interconnect interface 64 may be disposed in each LAB 126 and MLAB 102, according to embodiments of the present disclosure. Though a single interconnect interface 64 is shown to be disposed in each LAB 126 and MLAB 102, it should be understood that any suitable number of interconnect interfaces 64 (e.g., 1 to 20) may be disposed in each LAB 126 and MLAB 102, and that the interconnect interfaces 64 may be disposed in any suitable number or types of logic blocks.

The distributed scheme illustrated in FIG. 8 may be particularly useful for fabric die-to-fabric die connections as it is closely coupled with core fabric components, such as LABs 126 and RT block 106. In some circumstances, the columnar approach illustrated in at least FIG. 7 may be more suitable, such as where data bus connection is critical, or physical space in the LABs 126 and/or MLABs 102 is limited. For example, some architectures may include a certain number of electrostatic discharge diodes to be disposed in LABs 126 and/or MLABs 102, and, as such, there may not be sufficient space in the LABs 126 and/or MLABs 102 to accommodate the interconnect interfaces 64.

The interconnect interface 64 may reduce latency as it may have further reach (e.g., connection) into the programmable fabric 42 of the fabric die 40 than horizontal and/or vertical input/output (HIO and/or VIO) interfaces used in monolithic FPGA designs without blocking or excessively using routing circuitry of the fabric die 40. That is, instead of having to route data through an excessive amount of programmable fabric of the sector between source/destination logic blocks positioned deep in the fabric die (e.g., separate and further away from the shoreline of the fabric die) and the horizontal and/or vertical input/output interfaces that are typically positioned at an edge of the fabric die (such as the shoreline), the presently disclosed fabric die 40 enables routing data between the source/destination logic blocks and a typically more closely located interconnect interface 64, which may quickly send the data to or receive the data from a respectively electrically coupled microbump 80 (which in turn may be electrically coupled to a destination/source fabric die). In other words, because the interconnect interfaces 64 may be spread throughout the fabric die 40, routing may not be restricted to the edges of the programmable fabric 42, and traditional routing congestion may be alleviated. For example, the interconnect interface 64 may replace at least some of the vertical input/output interfaces and may provide, for example, ten times more reach for wire connection to the fabric die 40 than the horizontal and/or vertical input/output interfaces.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device comprising:
   a first die comprising:
      a first plurality of rows, wherein a first row of the first plurality of rows comprises:
         a row of compute blocks;
         a first inter-die interconnect interface coupled to a compute block of the row of compute blocks in the row of compute blocks; and
         a first electrical connection electrically coupled to the first inter-die interconnect interface; and
   a second die comprising:
      a second plurality of rows, wherein a first row of the second plurality of rows comprises:
         a row of memory blocks;
         a second inter-die interconnect interface associated with the row of memory blocks; and
         a second electrical connection electrically coupled to the second inter-die interconnect interface, wherein the first electrical connection and the second electrical connection are electrically coupled, and wherein the first inter-die interconnect interface and the second inter-die interconnect interface are configured to enable communication between the first die and the second die via the first electrical connection and the second electrical connection.

2. The device of claim 1, wherein the first inter-die interconnect interface is disposed on a shoreline of the first die and extends to the shoreline of the first die.

3. The device of claim 2, wherein the second inter-die interconnect interface is disposed on a shoreline of the second die, and is parallel to the shoreline of the second die.

4. The device of claim 1, wherein the first plurality of rows comprises a second row of compute blocks disposed parallel to a shoreline of the first die, wherein the row of compute blocks is adjacent to the second row of compute blocks and disposed parallel to the shoreline of the first die.

5. The device of claim 1, wherein the second plurality of rows comprises a second row of memory blocks disposed parallel to a shoreline of the second die, wherein the row of memory blocks is adjacent to the second row of memory blocks and is disposed parallel to the shoreline of the second die.

6. The device of claim 1, comprising a plurality of horizontal input/output interfaces, wherein the plurality of horizontal input/output interfaces are configured to enable the first die to communicate with the second die.

7. The device of claim 1, comprising an interposer, wherein the first electrical connection, the second electrical connection, or both comprise a plurality of microbumps.

8. The device of claim 7, comprising an interposer, wherein the first die and the second die are disposed in the interposer, and the first electrical connection and the second electrical connection are electrically coupled together via a wire-to-wire connection disposed on the interposer.

9. A die comprising:
   a shoreline; and
   a plurality of rows, wherein a row of the plurality of rows comprises:
      a set of memory blocks separate from the shoreline of the die; and
      an inter-die interconnect interface coupled via a set of microbumps to the set of memory blocks, wherein the inter-die interconnect interface is configured to communicatively couple the die to a second die.

10. The die of claim 9, wherein the set of memory blocks comprises logic array blocks, memory logic array blocks, logic element input multiplexer blocks, configurable random-access memory, or any combination thereof.

11. The die of claim 9, wherein the inter-die interconnect interface is configured to electrically couple to a plurality of microbumps disposed on the side of the die.

12. The die of claim 11, wherein the plurality of microbumps are configured to facilitate bidirectional or unidirectional communication.

13. The die of claim 11, wherein the plurality of microbumps are configured to communicatively couple to an additional plurality of microbumps of the second die, and the additional plurality of microbumps is configured to communicatively couple to an additional inter-die interconnect interface of the second die.

14. The die of claim 13, wherein the plurality of microbumps and the additional plurality of microbumps are configured to communicatively couple via a wire-to-wire connection disposed on a silicon interposer.

15. The die of claim 9, wherein the row of the plurality of rows comprises a plurality of sets of compute blocks comprising a set of compute blocks, wherein at least some sets of compute blocks of the plurality of sets of compute blocks comprise a plurality of logic array blocks, wherein at least some logic array blocks of the plurality of logic array blocks comprise a respective inter-die interconnect interface.

16. The die of claim 9, wherein the die comprises a plurality of sectors, each respective sector of the plurality of sectors comprises a respective plurality of rows.

17. The die of claim 16, wherein the inter-die interconnect interface is disposed on the shoreline.

18. A data processing system comprising:
a network interface;
a memory;
processing circuitry coupled to the network interface and the memory;
a first die comprising a first row comprising a first plurality of interconnect interfaces configured to electrically couple to a first plurality of electrical connections disposed on a side of the first die;
a second die comprising a second row comprising a second plurality of interconnect interfaces configured to electrically couple to a second plurality of electrical connections disposed on a side of the second die; and
a silicon interposer configured to electrically couple to the first plurality of electrical connections and the second plurality of electrical connections.

19. The data processing system of claim 18, wherein the second die comprises a first row comprising compute circuitry and a second row comprising second compute circuitry.

20. The data processing system of claim 18, wherein the second die comprises the network interface and the processing circuitry.

* * * * *